(12) United States Patent
Chuang

(10) Patent No.: US 11,463,082 B2
(45) Date of Patent: Oct. 4, 2022

(54) WAVEFORM CONVERSION CIRCUIT FOR GATE-DRIVING CIRCUIT

(71) Applicant: Delta Electronics, Inc., Taoyuan (TW)

(72) Inventor: Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/148,012

(22) Filed: Jan. 13, 2021

(65) Prior Publication Data

US 2021/0226621 A1 Jul. 22, 2021

Related U.S. Application Data

(60) Provisional application No. 62/964,381, filed on Jan. 22, 2020.

(51) Int. Cl.
*H03K 17/16* (2006.01)
*H03K 3/012* (2006.01)
*H02H 1/00* (2006.01)
*H02H 9/02* (2006.01)
*H02M 1/08* (2006.01)
*H02M 1/32* (2007.01)
*H03K 17/687* (2006.01)

(52) U.S. Cl.
CPC ......... *H03K 17/165* (2013.01); *H02H 1/0007* (2013.01); *H02H 9/02* (2013.01); *H02M 1/08* (2013.01); *H02M 1/32* (2013.01); *H03K 3/012* (2013.01); *H03K 17/687* (2013.01); *H03K 2217/0036* (2013.01)

(58) Field of Classification Search
CPC .............................. H03K 17/165; H03K 3/012
USPC .......................................................... 327/109
See application file for complete search history.

(56) References Cited

U.S. PATENT DOCUMENTS 5,977,814 A * 11/1999 Ishii ..................... H03K 17/168
327/108
8,558,587 B2 * 10/2013 Machida ............. H02M 3/1588
327/109

* cited by examiner

*Primary Examiner* — Metasebia T Retebo
(74) *Attorney, Agent, or Firm* — Muncy, Geissler, Olds & Lowe, P.C.

(57) ABSTRACT

A gate-driving circuit for turning on and off a switch device having a gate terminal, a drain terminal, and a source terminal coupled to a reference node is provided. The gate-driving circuit includes a controller and a waveform conversion circuit. The controller includes a first switch supplying a high voltage level to a first node, a second switch coupling the first node to a low voltage level of the reference node, and a third switch coupling a second node to the low voltage level. The second node is coupled to the gate terminal. When the first switch is turned on for the first time during startup, the third switch is turned on simultaneously. The waveform conversion circuit includes a first resistor coupled between the first node and the second node and a first capacitor coupled between the first node and the second node.

27 Claims, 12 Drawing Sheets

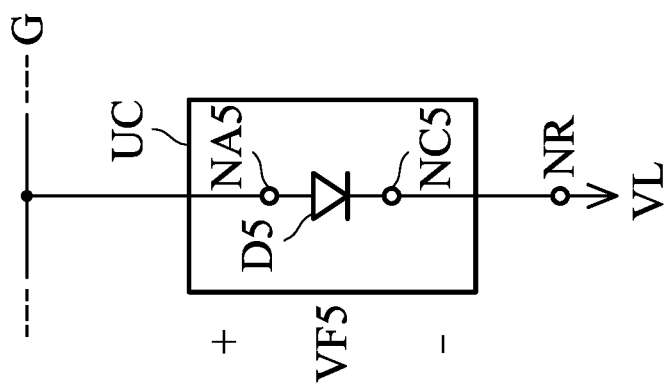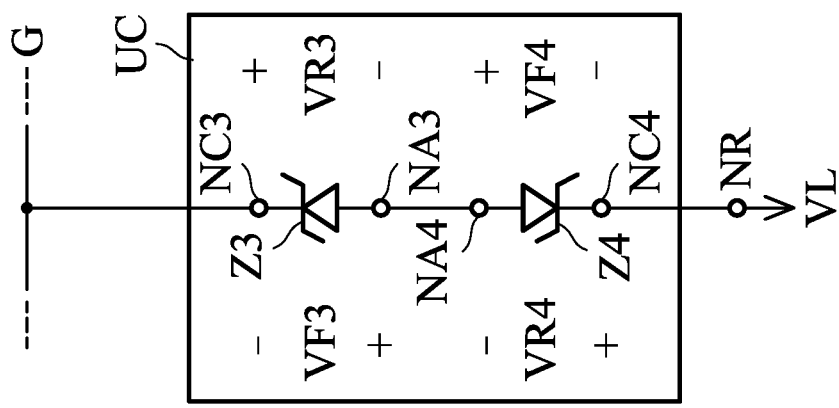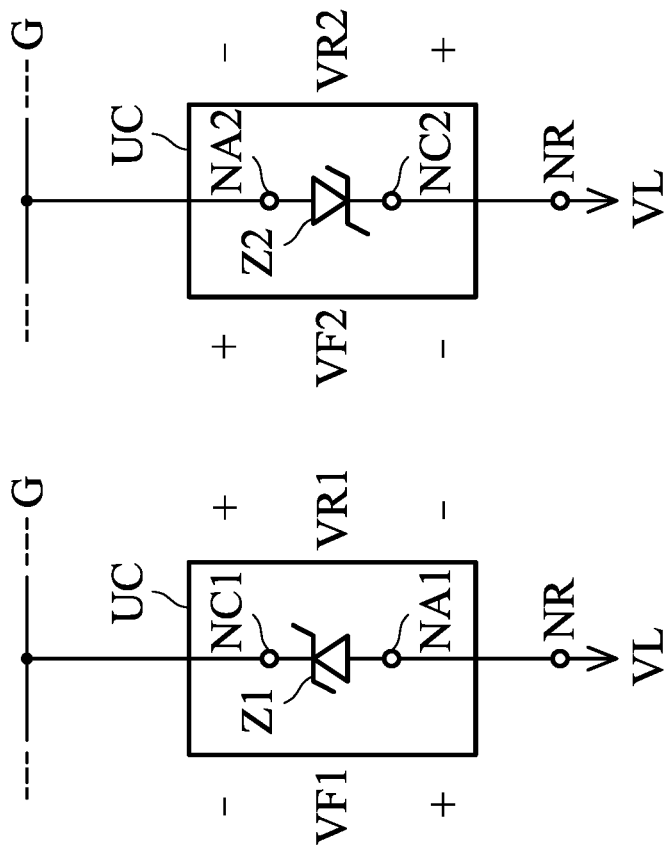
FIG. 13  FIG. 14  FIG. 15  FIG. 16

WAVEFORM CONVERSION CIRCUIT FOR GATE-DRIVING CIRCUIT

CROSS REFERENCE TO RELATED APPLICATIONS

This application claims the benefit of U.S. Provisional Application No. 62/964,381, filed on Jan. 22, 2020, the entirety of which is incorporated by reference herein.

BACKGROUND OF THE INVENTION

Field of the Invention

The disclosure relates generally to a gate-driving circuit for driving the gate of a switching element.

Description of the Related Art

A GaN device has great potential compared to existing Si devices, and therefore, is anticipated for practical use. A standard GaN FET is a normally-on device, and therefore, needs a negative power source. On the other hand, a normally-off GaN FET is very difficult to produce. A normally-off GaN FET has a threshold voltage, which is very low compared to that of existing Si MOSFETs. This is the first problem with the normally-off GaN FET.

In addition, a normally-off GaN FET can break easily if a high voltage is applied to its gate, meaning that a normally-off GaN FET cannot be used in a normal driving IC. This is the second problem with the normally-off GaN FET. Due to these two problems, a gate-driving circuit for the Si MOSFET (IGBT, or Insulated Gate Bipolar Transistor) is not applicable, as it would be for a normally-off GaN FET. In other words, the normally-off GaN FET needs an exclusive gate-driving circuit.

In connection with the first problem, the turn-off time of the normally-off GaN FET will be shortened if a voltage that is sufficiently lower than the threshold voltage, and preferably a negative voltage lower than 0 V, is applied to the gate of the normally-off GaN FET. For this, the normally-off GaN FET needs a negative power source. A negative power source is undesirable, however, although it is necessary for realizing a normally-off state.

In connection with the second problem, the turn-on time of the normally-off GaN FET can be shortened if a voltage that is sufficiently higher than the threshold voltage is applied to the gate of the normally-off GaN FET. More precisely, shortening the turn-on time requires an instantaneous large current, and creating such a large current is properly achievable with a higher voltage. It is, however, unable to apply a high voltage used for the Si MOSFET to the gate of the normally-off GaN FET because this breaks the normally-off GaN FET.

In addition, the gate of the normally-off GaN FET may experience interference from noise from the drain when the normally-off GaN FET is OFF, and as a result the normally-off GaN FET may be turned ON incorrectly. Therefore, an efficient waveform conversion circuit is urgently needed, and this waveform conversion circuit can be adopted for use with any type of transistor.

BRIEF SUMMARY OF THE INVENTION

A gate-driving circuit for driving a switch device is provided herein. A third switch is incorporated into the gate-driving circuit to prevent coupling noise from other circuits around the gate-driving circuit during startup so that the switch device can be properly driven.

In an embodiment, a gate-driving circuit for turning on and off a switch device is provided. The switch device has a gate terminal, a drain terminal, and a source terminal coupled to a reference node. The gate-driving circuit comprises a controller and a waveform conversion circuit. The controller comprises a first switch, a second switch, and a third switch. The first switch supplies a high voltage level to a first node. The second switch couples the first node to a low voltage level of the reference node. The third switch couples a second node to the low voltage level. The second node is coupled to the gate terminal. When the first switch is turned on for the first time during startup, the third switch is turned on simultaneously. The waveform conversion circuit comprises a first resistor and a first capacitor. The first resistor is coupled between the first node and the second node. The first capacitor is coupled between the first node and the second node.

According to another embodiment of the invention, the waveform conversion circuit further comprises a second resistor. The second resistor is coupled between the first capacitor and the first node.

According to another embodiment of the invention, the waveform conversion circuit further comprises a third resistor. The third resistor is coupled between the first node and the controller.

According to an embodiment of the invention, after the first switch is turned on for the first time, the third switch is turned on after the second switch is turned on and the third switch is turned off before the first switch is turned on.

According to another embodiment of the invention, after the first switch is turned on for the first time, the first switch and the third switch are simultaneously turned on.

According to another embodiment of the invention, after the first switch is turned on for the first time, the third switch stays off.

According to an embodiment of the invention, the first switch and the second switch are alternately turned on and off to alternately provide the high voltage level and the low voltage level to the first node. The waveform conversion circuit converts the low voltage level to a first voltage at the second node and converts the high voltage level to a second voltage at the second node.

According to another embodiment of the invention, the waveform conversion circuit further comprises a voltage clamp unit. The voltage clamp unit is coupled between the gate terminal and the source terminal of the switch device and configured to clamp the second voltage.

According to an embodiment of the invention, the voltage clamp unit comprises a first zener diode. The first zener diode comprises an anode and a cathode. The anode is coupled to the source terminal of the switch device, and the cathode is coupled to the gate terminal of the switch device. The first voltage is determined by a forward voltage of the first zener diode, and the second voltage is determined by a reverse breakdown voltage of the first zener diode.

According to another embodiment of the invention, the voltage clamp unit comprises a second zener diode. The second zener diode comprises an anode and a cathode. The anode is coupled to the gate terminal of the switch device, and the cathode is coupled to the source terminal of the switch device. The first voltage is determined by a reverse breakdown voltage of the second zener diode, and the second voltage is determined by a forward voltage of the second zener diode.

According to another embodiment of the invention, the voltage clamp unit comprises a third zener diode and a fourth zener diode. The third zener diode comprises a first anode and a first cathode. The first cathode is coupled to the gate terminal of the switch device. The fourth zener diode comprises a second anode and a second cathode. The second anode is coupled to the first anode, and the second cathode is coupled to the source terminal of the switch device. The first voltage is determined by a sum of a reverse breakdown voltage of the fourth zener diode and a forward voltage of the third zener diode. The second voltage is determined by a sum of a reverse breakdown voltage of the third zener diode and a forward voltage of the fourth zener diode.

According to another embodiment of the invention, the voltage clamp unit comprises a fifth diode. The fifth diode comprises an anode and a cathode. The anode is coupled to the gate terminal of the switch device, and the cathode is coupled to the source terminal of the switch device. The second voltage is determined by a forward voltage of the fifth diode.

According to another embodiment of the invention, the voltage clamp unit comprises a sixth diode and a seventh diode. The sixth diode comprises a sixth anode and a sixth cathode. The sixth cathode is coupled to the gate terminal of the switch device and the sixth anode is coupled to the source terminal of the switch device. The seventh diode comprises a seventh anode and a seventh cathode. The seventh anode is coupled to the gate terminal of the switch device, and the seventh cathode is coupled to the source terminal of the switch device. The first voltage is determined by a forward voltage of the sixth diode and the second voltage is determined by a forward voltage of the seventh diode.

According to another embodiment of the invention, the voltage clamp unit comprises an eighth diode and a ninth zener diode. The eighth diode comprises an eighth anode and an eighth cathode. The eighth anode is coupled to the gate terminal of the switch device. The ninth zener diode comprises a ninth anode and a ninth cathode. The ninth anode is coupled to the source terminal of the switch device, and the ninth cathode is coupled to the eighth cathode. The second voltage is determined by a sum of a reverse breakdown voltage of the ninth zener and a forward voltage of the eighth diode.

According to another embodiment of the invention, the voltage clamp unit comprises a tenth zener diode and an eleventh diode. The tenth zener diode comprises a tenth anode and a tenth cathode. The tenth anode is coupled to the gate terminal of the switch device. The eleventh diode comprises an eleventh anode and an eleventh cathode. The eleventh anode is coupled to the source terminal of the switch device, and the eleventh cathode is coupled to the tenth cathode. The first voltage is determined by a sum of a reverse breakdown voltage of the tenth zener diode and a forward voltage of the eleventh diode.

In another embodiment, a gate-driving circuit for turning on and off a switch device is provided. The switch device has a gate terminal, a drain terminal, and a source terminal coupled to a reference node. The gate-driving circuit comprises a controller and a waveform conversion circuit. The controller comprises a first switch, a second switch, and a third switch. The first switch supplies a high voltage level to a first node. The second switch couples the second node to a low voltage level of the reference node. The third switch couples a third node to the low voltage level. The third node is coupled to the gate terminal. When the first switch is turned on for the first time during startup, the third switch is turned on simultaneously. The waveform conversion circuit comprises a first resistor, a fourth resistor, and a first capacitor. The first resistor is coupled between the first node and the third node. The fourth resistor is coupled between the first node and the second node. The first capacitor is coupled between the second node and the third node.

According to another embodiment of the invention, the waveform conversion circuit further comprises a fifth resistor. The fifth resistor is coupled between the second switch and the second node.

According to an embodiment of the invention, after the first switch is turned on for the first time, the third switch is turned on after the second switch is turned on and the third switch is turned off before the first switch is turned on.

According to another embodiment of the invention, after the first switch is turned on for the first time, the first switch and the third switch are simultaneously turned on.

According to another embodiment of the invention, after the first switch is turned on for the first time, the third switch stays off.

According to an embodiment of the invention, the first switch and the second switch are alternately turned on and off to alternately provide the high voltage level and the low voltage level. The waveform conversion circuit converts the low voltage level to a first voltage at the third node and converts the high voltage level to a second voltage at the third node.

According to another embodiment of the invention, the waveform conversion circuit further comprises a voltage clamp unit. The voltage clamp unit is coupled between the gate terminal and the source terminal of the switch device and configured to clamp the second voltage.

According to an embodiment of the invention, the voltage clamp unit comprises a first zener diode. The first zener diode comprises an anode and a cathode. The anode is coupled to the source terminal of the switch device, and the cathode is coupled to the gate terminal of the switch device. The first voltage is determined by a forward voltage of the first zener diode, and the second voltage is determined by a reverse breakdown voltage of the first zener diode.

According to another embodiment of the invention, the voltage clamp unit comprises a second zener diode. The second zener diode comprises an anode and a cathode. The anode is coupled to the gate terminal of the switch device, and the cathode is coupled to the source terminal of the switch device. The first voltage is determined by a reverse breakdown voltage of the second zener diode, and the second voltage is determined by a forward voltage of the second zener diode.

According to another embodiment of the invention, the voltage clamp unit comprises a third zener diode and a fourth zener diode. The third zener diode comprises a first anode and a first cathode. The first cathode is coupled to the gate terminal of the switch device. The fourth zener diode comprises a second anode and a second cathode. The second anode is coupled to the first anode, and the second cathode is coupled to the source terminal of the switch device. The first voltage is determined by a sum of a reverse breakdown voltage of the fourth zener diode and a forward voltage of the third zener diode. The second voltage is determined by a sum of a reverse breakdown voltage of the third zener diode and a forward voltage of the fourth zener diode.

According to another embodiment of the invention, the voltage clamp unit comprises a fifth diode. The fifth diode comprises an anode and a cathode. The anode is coupled to the gate terminal of the switch device, and the cathode is coupled to the source terminal of the switch device. The second voltage is determined by a forward voltage of the fifth diode.

According to another embodiment of the invention, the voltage clamp unit comprises a sixth diode and a seventh diode. The sixth diode comprises a sixth anode and a sixth cathode. The sixth cathode is coupled to the gate terminal of the switch device and the sixth anode is coupled to the source terminal of the switch device. The seventh diode comprises a seventh anode and a seventh cathode. The seventh anode is coupled to the gate terminal of the switch device, and the seventh cathode is coupled to the source terminal of the switch device. The first voltage is determined by a forward voltage of the sixth diode and the second voltage is determined by a forward voltage of the seventh diode.

According to another embodiment of the invention, the voltage clamp unit comprises an eighth diode and a ninth zener diode. The eighth diode comprises an eighth anode and an eighth cathode. The eighth anode is coupled to the gate terminal of the switch device. The ninth zener diode comprises a ninth anode and a ninth cathode. The ninth anode is coupled to the source terminal of the switch device, and the ninth cathode is coupled to the eight cathode. The second voltage is determined by a sum of a reverse breakdown voltage of the ninth zener and a forward voltage of the eighth diode.

According to another embodiment of the invention, the voltage clamp unit comprises a tenth zener diode and an eleventh diode. The tenth zener diode comprises a tenth anode and a tenth cathode. The tenth anode is coupled to the gate terminal of the switch device. The eleventh diode comprises an eleventh anode and an eleventh cathode. The eleventh anode is coupled to the source terminal of the switch device, and the eleventh cathode is coupled to the tenth cathode. The first voltage is determined by a sum of a reverse breakdown voltage of the tenth zener diode and a forward voltage of the eleventh diode.

In another embodiment, a gate-driving circuit for turning on and off a switch device is provided. The switch device has a gate terminal, a drain terminal, and a source terminal coupled to a reference node. The gate-driving circuit comprises a controller and a waveform conversion circuit. The controller comprises a first switch, a second switch, and a third switch. The first switch supplies a high voltage level to a first node. The second switch couples a second node to a low voltage level of the reference node. The third switch couples a third node to the low voltage level. The third node is coupled to the gate terminal. When the first switch is turned on for the first time during startup, the third switch is turned on simultaneously. The waveform conversion circuit comprises a first resistor, a sixth resistor, and a first capacitor. The first resistor is coupled between the second node and the third node. The sixth resistor is coupled between the first node and the second node. The first capacitor is coupled between the second node and the third node.

According to an embodiment of the invention, after the first switch is turned on for the first time, the third switch is turned on after the second switch is turned on and the third switch is turned off before the first switch is turned on.

According to an embodiment of the invention, after the first switch is turned on for the first time, the first switch and the third switch are simultaneously turned on.

According to an embodiment of the invention, after the first switch is turned on for the first time, the third switch stays off.

According to an embodiment of the invention, the first switch and the second switch are alternately turned on and off to alternately provide the high voltage level and the low voltage level. The waveform conversion circuit converts the low voltage level to a first voltage at the third node and converts the high voltage level to a second voltage at the third node.

According to another embodiment of the invention, the waveform conversion circuit further comprises a voltage clamp unit. The voltage clamp unit is coupled between the gate terminal and the source terminal of the switch device and configured to clamp the second voltage.

According to an embodiment of the invention, the voltage clamp unit comprises a first zener diode. The first zener diode comprises an anode and a cathode. The anode is coupled to the source terminal of the switch device, and the cathode is coupled to the gate terminal of the switch device. The first voltage is determined by a forward voltage of the first zener diode, and the second voltage is determined by a reverse breakdown voltage of the first zener diode.

According to another embodiment of the invention, the voltage clamp unit comprises a second zener diode. The second zener diode comprises an anode and a cathode. The anode is coupled to the gate terminal of the switch device, and the cathode is coupled to the source terminal of the switch device. The first voltage is determined by a reverse breakdown voltage of the second zener diode, and the second voltage is determined by a forward voltage of the second zener diode.

According to another embodiment of the invention, the voltage clamp unit comprises a third zener diode and a fourth zener diode. The third zener diode comprises a first anode and a first cathode. The first cathode is coupled to the gate terminal of the switch device. The fourth zener diode comprises a second anode and a second cathode. The second anode is coupled to the first anode, and the second cathode is coupled to the source terminal of the switch device. The first voltage is determined by a sum of a reverse breakdown voltage of the fourth zener diode and a forward voltage of the third zener diode. The second voltage is determined by a sum of a reverse breakdown voltage of the third zener diode and a forward voltage of the fourth zener diode.

According to another embodiment of the invention, the voltage clamp unit comprises a fifth diode. The fifth diode comprises an anode and a cathode. The anode is coupled to the gate terminal of the switch device, and the cathode is coupled to the source terminal of the switch device. The second voltage is determined by a forward voltage of the fifth diode.

According to another embodiment of the invention, the voltage clamp unit comprises a sixth diode and a seventh diode. The sixth diode comprises a sixth anode and a sixth cathode. The sixth cathode is coupled to the gate terminal of the switch device and the sixth anode is coupled to the source terminal of the switch device. The seventh diode comprises a seventh anode and a seventh cathode. The seventh anode is coupled to the gate terminal of the switch device, and the seventh cathode is coupled to the source terminal of the switch device. The first voltage is determined by a forward voltage of the sixth diode and the second voltage is determined by a forward voltage of the seventh diode.

According to another embodiment of the invention, the voltage clamp unit comprises an eighth diode and a ninth zener diode. The eighth diode comprises an eighth anode and an eighth cathode. The eighth anode is coupled to the gate terminal of the switch device. The ninth zener diode comprises a ninth anode and a ninth cathode. The ninth anode is coupled to the source terminal of the switch device, and the ninth cathode is coupled to the eight cathode. The second voltage is determined by a sum of a reverse breakdown voltage of the ninth zener and a forward voltage of the eighth diode.

According to another embodiment of the invention, the voltage clamp unit comprises a tenth zener diode and an eleventh diode. The tenth zener diode comprises a tenth anode and a tenth cathode. The tenth anode is coupled to the gate terminal of the switch device. The eleventh diode comprises an eleventh anode and an eleventh cathode. The eleventh anode is coupled to the source terminal of the switch device, and the eleventh cathode is coupled to the tenth cathode. The first voltage is determined by a sum of a reverse breakdown voltage of the tenth zener diode and a forward voltage of the eleventh diode.

In another embodiment, a gate-driving circuit for turning on and off a switch device is provided. The switch device has a gate terminal, a drain terminal, and a source terminal coupled to a reference node. The gate-driving circuit comprises a controller and a waveform conversion circuit. The controller comprises a first switch, a second switch, and a third switch. The first switch supplies a high voltage level to a first node. The second switch couples a second node to a low voltage level of the reference node. The third switch couples a third node to the low voltage level. The third node is coupled to the gate terminal. When the first switch is turned on for the first time during startup, the third switch is turned on simultaneously. The waveform conversion circuit comprises a first resistor, a seventh resistor, and a first capacitor. The first resistor is coupled between the first node and the third node. The seventh resistor is coupled between the first node and the second node. The first capacitor is coupled between the first node and the third node.

According to an embodiment of the invention, after the first switch is turned on for the first time, the third switch is turned on after the second switch is turned on and the third switch is turned off before the first switch is turned on.

According to another embodiment of the invention, after the first switch is turned on for the first time, the first switch and the third switch are simultaneously turned on.

According to another embodiment of the invention, after the first switch is turned on for the first time, the third switch stays off.

According to an embodiment of the invention, the first switch and the second switch are alternately turned on and off to alternately provide the high voltage level and the low voltage level, wherein the waveform conversion circuit converts the low voltage level to a first voltage at the third node and converts the high voltage level to a second voltage at the third node.

According to another embodiment of the invention, the waveform conversion circuit further comprises a voltage clamp unit. The voltage clamp unit is coupled between the gate terminal and the source terminal of the switch device and configured to clamp the second voltage.

According to an embodiment of the invention, the voltage clamp unit comprises a first zener diode. The first zener diode comprises an anode and a cathode. The anode is coupled to the source terminal of the switch device, and the cathode is coupled to the gate terminal of the switch device. The first voltage is determined by a forward voltage of the first zener diode, and the second voltage is determined by a reverse breakdown voltage of the first zener diode.

According to another embodiment of the invention, the voltage clamp unit comprises a second zener diode. The second zener diode comprises an anode and a cathode. The anode is coupled to the gate terminal of the switch device, and the cathode is coupled to the source terminal of the switch device. The first voltage is determined by a reverse breakdown voltage of the second zener diode, and the second voltage is determined by a forward voltage of the second zener diode.

According to another embodiment of the invention, the voltage clamp unit comprises a third zener diode and a fourth zener diode. The third zener diode comprises a first anode and a first cathode. The first cathode is coupled to the gate terminal of the switch device. The fourth zener diode comprises a second anode and a second cathode. The second anode is coupled to the first anode, and the second cathode is coupled to the source terminal of the switch device. The first voltage is determined by a sum of a reverse breakdown voltage of the fourth zener diode and a forward voltage of the third zener diode. The second voltage is determined by a sum of a reverse breakdown voltage of the third zener diode and a forward voltage of the fourth zener diode.

According to another embodiment of the invention, the voltage clamp unit comprises a fifth diode. The fifth diode comprises an anode and a cathode. The anode is coupled to the gate terminal of the switch device, and the cathode is coupled to the source terminal of the switch device. The second voltage is determined by a forward voltage of the fifth diode.

According to another embodiment of the invention, the voltage clamp unit comprises a sixth diode and a seventh diode. The sixth diode comprises a sixth anode and a sixth cathode. The sixth cathode is coupled to the gate terminal of the switch device and the sixth anode is coupled to the source terminal of the switch device. The seventh diode comprises a seventh anode and a seventh cathode. The seventh anode is coupled to the gate terminal of the switch device, and the seventh cathode is coupled to the source terminal of the switch device. The first voltage is determined by a forward voltage of the sixth diode and the second voltage is determined by a forward voltage of the seventh diode.

According to another embodiment of the invention, the voltage clamp unit comprises an eighth diode and a ninth zener diode. The eighth diode comprises an eighth anode and an eighth cathode. The eighth anode is coupled to the gate terminal of the switch device. The ninth zener diode comprises a ninth anode and a ninth cathode. The ninth anode is coupled to the source terminal of the switch device, and the ninth cathode is coupled to the eighth cathode. The second voltage is determined by a sum of a reverse breakdown voltage of the ninth zener and a forward voltage of the eighth diode.

According to another embodiment of the invention, the voltage clamp unit comprises a tenth zener diode and an eleventh diode. The tenth zener diode comprises a tenth anode and a tenth cathode. The tenth anode is coupled to the gate terminal of the switch device. The eleventh diode comprises an eleventh anode and an eleventh cathode. The eleventh anode is coupled to the source terminal of the switch device, and the eleventh cathode is coupled to the tenth cathode. The first voltage is determined by a sum of a reverse breakdown voltage of the tenth zener diode and a forward voltage of the eleventh diode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 13 is a block diagram of a voltage clamp unit in accordance with an embodiment of the invention;

FIG. 14 is a block diagram of a voltage clamp unit in accordance with another embodiment of the invention;

FIG. 15 is a block diagram of a voltage clamp unit in accordance with another embodiment of the invention;

FIG. 16 is a block diagram of a voltage clamp unit in accordance with another embodiment of the invention;

DETAILED DESCRIPTION OF THE INVENTION

Figure 1:
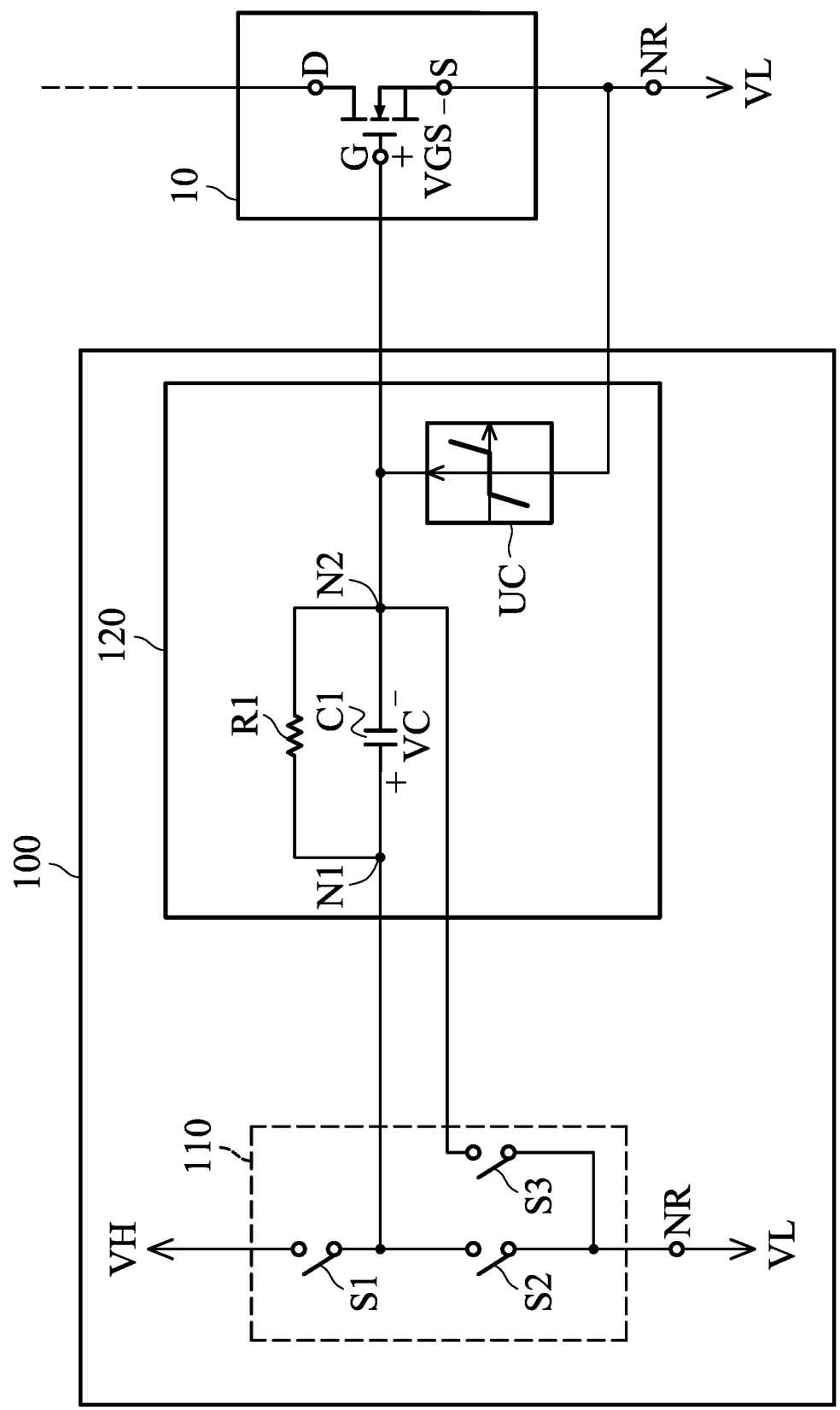
FIG. 1 is a block diagram of a gate-driving circuit in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a gate-driving circuit in accordance with an embodiment of the invention. As shown in FIG. 1, the gate-driving circuit 100 is configured to turn ON/OFF the switch device 10 which includes the gate terminal G, the source terminal S, and the drain terminal D. According to an embodiment of the invention, the switch device 10 is a normally-off transistor. According to another embodiment of the invention, the switch device is a normally-off GaN FET.

The gate-driving circuit 100 includes the controller 110 and the waveform conversion circuit 120. The controller 110, which is supplied by the high voltage level VH and the low voltage level VL, includes the first switch S1, the second switch S2 and the third switch S3. The first switch S1 and the second switch S2 are alternately turned ON and OFF to generate ON/OFF pulses at the first node N1. When the first switch S1 is turned on for the first time during startup of the gate-driving circuit 100, the third switch S3 is turned on simultaneously to pull the second node N2 down to the low voltage level VL. The controller 110 is simplified as the first switch S1 the second switch S2 and the third switch S3 for the simplicity of explanation. The third switch S3 is configured to reduce noise coupling, which will be fully discussed in the following paragraphs.

As shown in FIG. 1, the waveform conversion circuit 120 includes a first resistor R1 and a first capacitor C1. The first resistor R1 is coupled between the first node N1 and the second node N2. The first capacitor C1 is coupled between the first node N1 and the second node N2. The purpose of the first resistor R1 and the first capacitor C1 will be discussed in the following paragraphs.

According to an embodiment of the invention, the waveform conversion circuit 120 may further include a voltage clamp unit UC. The voltage clamp unit UC configured to clamp the capacitor voltage VC stored in the first capacitor C1 and the voltage across the gate terminal G and the source terminal S of the switch device 10. According to an embodiment of the invention, the low voltage level VL of the reference node NR is equal to the ground level. According to another embodiment of the invention, the low voltage level VL of the reference node NR may be other voltage level.

Figure 2:
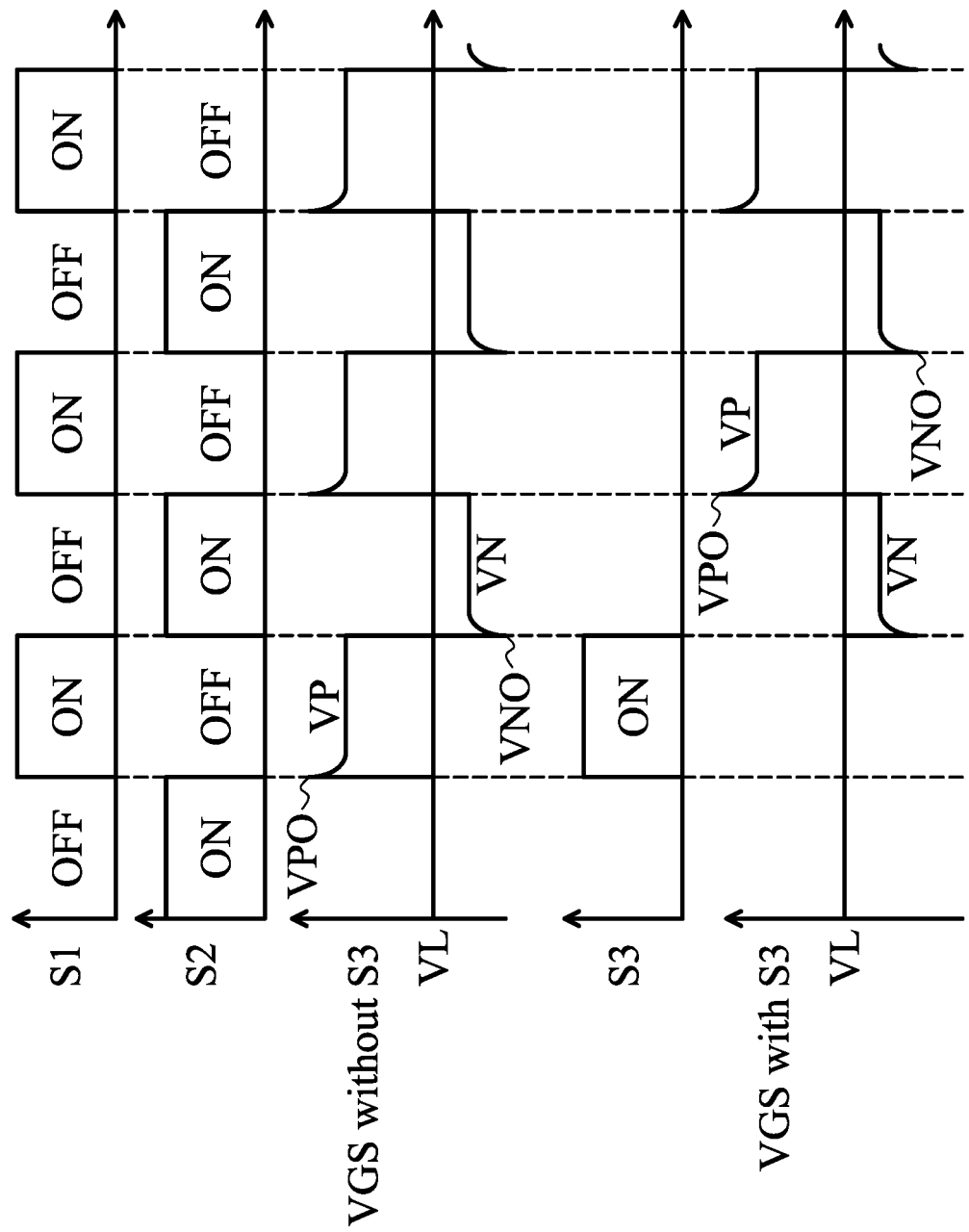
FIG. 2 illustrates the function of the gate-driving circuit in accordance with an embodiment of the invention.

FIG. 2 illustrates the function of the gate-driving circuit in accordance with an embodiment of the invention. For the simplicity of explanation, the description of FIG. 2 will be accompanied with FIG. 1.

As shown in FIG. 2, it is assumed that the third switch S3 in FIG. 1 is omitted. According to an embodiment of the invention, when the first switch S1 is turned ON and the second switch S2 is turned OFF, the waveform conversion circuit 120 receives the high voltage level VH at the first node N1. The voltage clamp unit UC clamps the gate-to-source voltage VGS without the third switch S3 of the switch device 10 at the second voltage VP. The first resistor R1 is configured to control the current flowing from the high voltage level VL to the low voltage level VL of the reference node NR through the voltage clamp unit UC.

The overshoot voltage VPO can be determined by the first capacitor C1 and the parasitic resistance along the path from the control signal SC to the voltage clamp unit UC through the first capacitor C1. According to an embodiment of the invention, the overshoot voltage VPO is equal to, or lower than, the high voltage level VH, but higher than VP. According to an embodiment of the invention, the overshoot voltage VPO of the gate-to-source voltage VGS without the third switch S3 is configured to turn ON the switch device 10 at a faster speed, and gate-to-source voltage VGS without the third switch S3 is then clamped at the second voltage VP to keep the conduction loss of the switch device 10 reasonably low.

According to another embodiment of the invention, when the first switch S1 is turned OFF and the second switch S2 is turned ON, the waveform conversion circuit 120 receives the low voltage level VL at the first node N1. Since the capacitor voltage VC has been stored in the first capacitor C1 when at the high voltage level VH is provided to the first node N1, the gate-to-source voltage VGS without the third switch S3 is a negative voltage when the low voltage level VL is applied to the first capacitor C1. In addition, gate-to-source voltage VGS without the third switch S3 is then clamped at the first voltage VN of the voltage clamp unit UC.

Likewise, the undershoot voltage VNO is also determined by the first capacitor C1 and the parasitic resistance along the path from the second switch S2 to the voltage clamp unit UC through the first capacitor C1. According to an embodiment of the invention, the undershoot voltage VNO of the gate-to-source voltage VGS without the third switch S3 is configured to turn OFF the switch device 10 at a faster speed, and the gate-to-source voltage VGS without the third switch S3 is then clamped at the first voltage VN to keep the leakage loss of the switch device 10 reasonably low. According to an embodiment of the invention, the first voltage VN, which is less than the low voltage level VL of the reference node NR, is configured to prevent the switch device 10 to be turned ON by noise coupling.

However, as shown in FIG. 2, the gate-to-source voltage VGS without the third switch S3 is positive after the gate-driving circuit 100 is started up, which may lead to noise coupled to other circuits around the gate-driving circuit 100.

The third switch S3 is incorporated to reduce noise coupling issue. According to another embodiment of the invention, when the first switch S1 is turned ON for the first time during startup, the third switch S3 is turned on simultaneously. The gate-to-source voltage VGS with the third switch S3 is equal to the low voltage level VL. Then, when the second switch S2 is turned ON and the first switch S1 and the third switch S3 are turned OFF, the waveform conversion circuit 120 generates the gate-to-source voltage VGS with the third switch S3 to be negative. Since the negative gate-to-source voltage VGS is generated during startup, it prevents noise coupling so that other circuits around the gate-driving circuit 100 can operate normally.

According to an embodiment of the invention, the first switch S1 and the third switch S3 are simultaneously turned ON, and the duty cycle of the switch S3 may be equal to, or more than, that of the first switch S1. According to an embodiment of the invention, the third switch S3 is turned ON once during startup, and then stays off.

Figure 3:
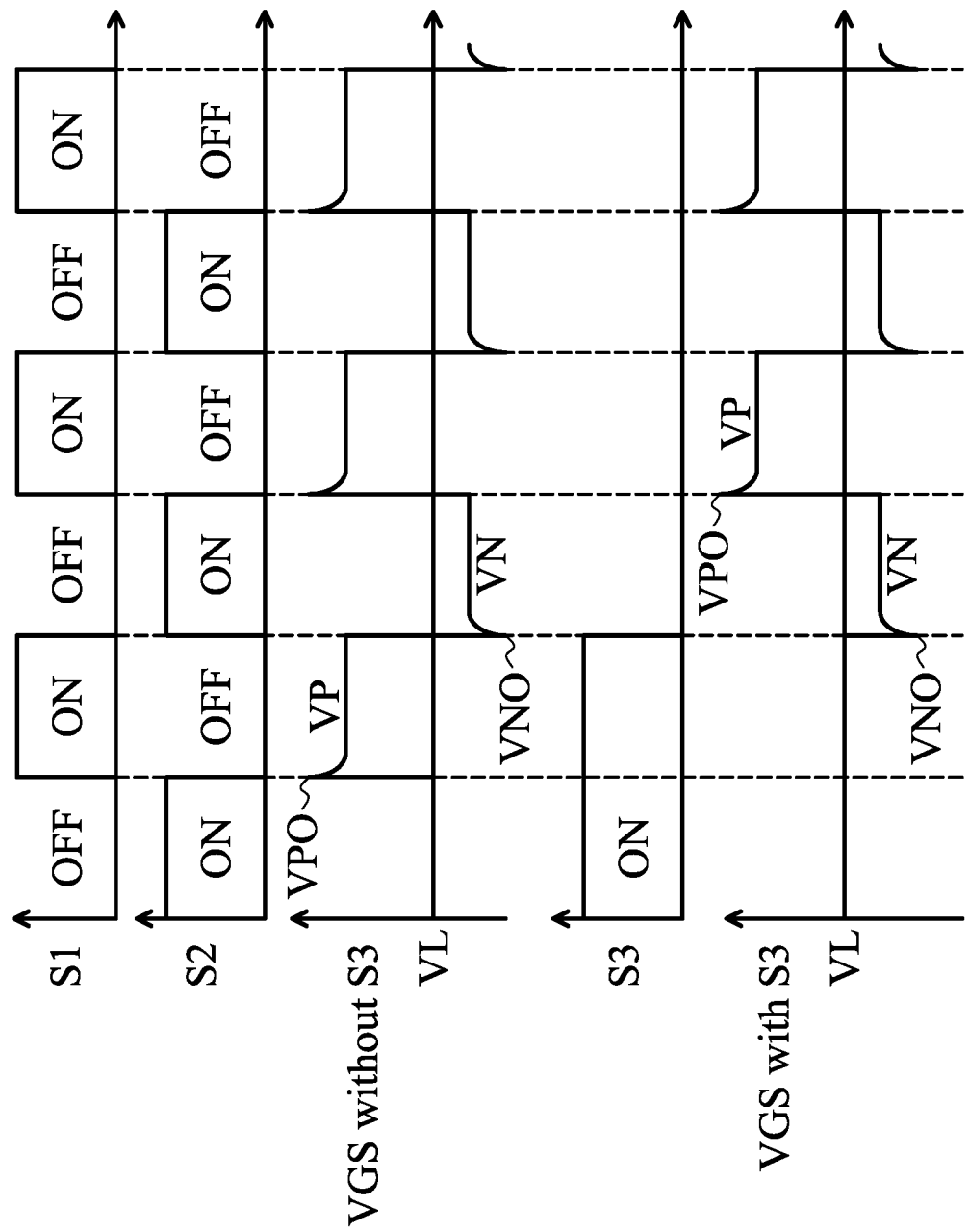
FIG. 3 illustrates the function of the gate-driving circuit in accordance with another embodiment of the invention.

FIG. 3 illustrates the function of the gate-driving circuit in accordance with another embodiment of the invention. As shown in FIG. 3, the duty cycle of the third switch S3 exceeds that of the first switch S1. However, when the first switch S1 is turned ON for the first time during startup, the third switch S3 is also turned ON, and the gate-to-source voltage VGS with the third switch S3 is identical to that in FIG. 2. According to an embodiment of the invention, the third switch S3 is turned ON once during startup, and then stays off.

Figure 4:
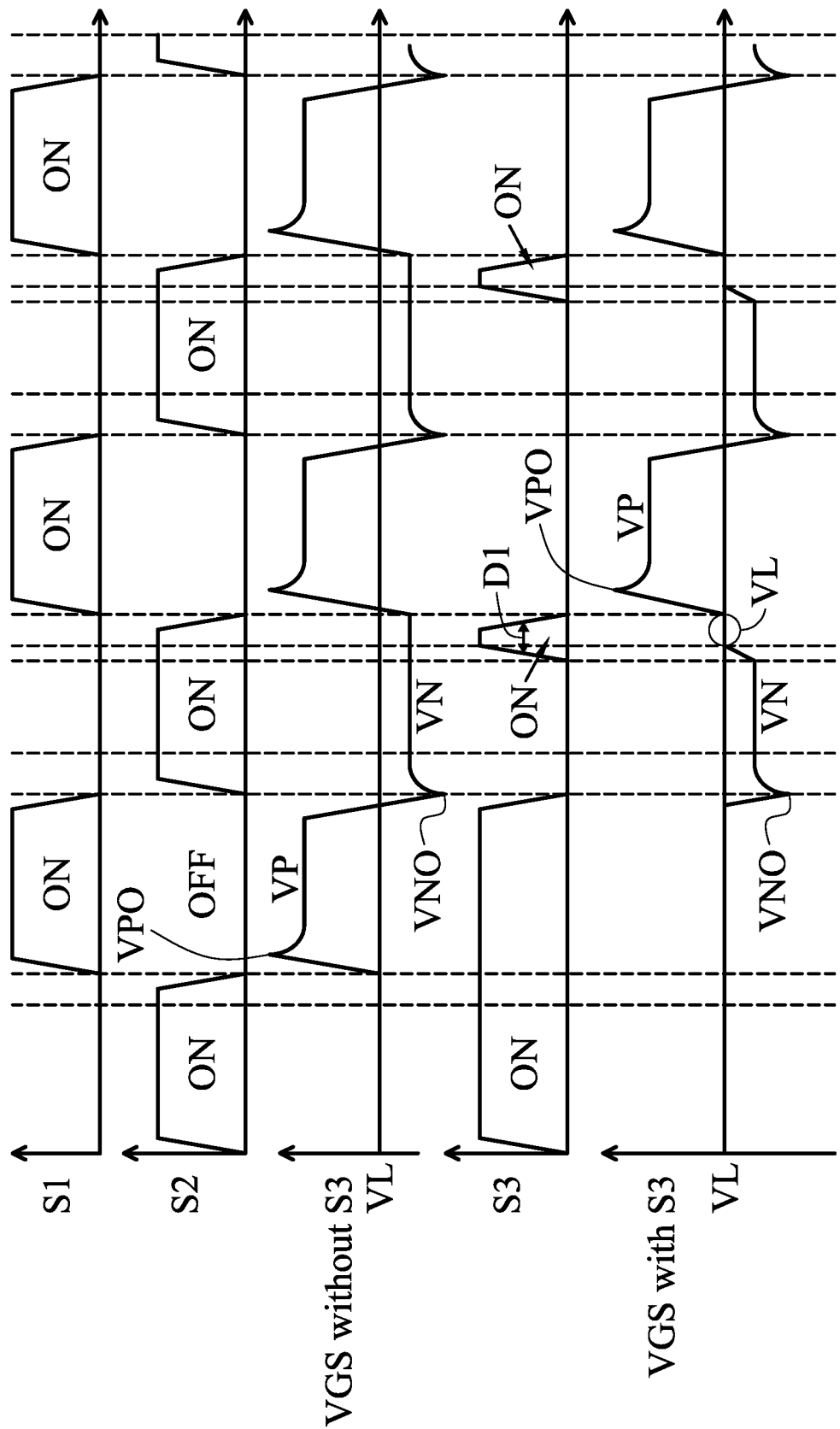
FIG. 4 illustrates the function of the gate-driving circuit in accordance with another embodiment of the invention.

FIG. 4 illustrates the function of the gate-driving circuit in accordance with another embodiment of the invention. After the first switch S1 is turned on for the first time, the third switch S3 is turned on after the second switch S2 is turned on and the third switch S3 is turned off before the first switch S1 is turned on. As shown in FIG. 3, when the third switch S3 is turned ON after the second switch S2 has been turned ON, the gate-to-source voltage VGS with the third switch S3 of the switch device 10 is equal to the low voltage level VL.

Figure 5:
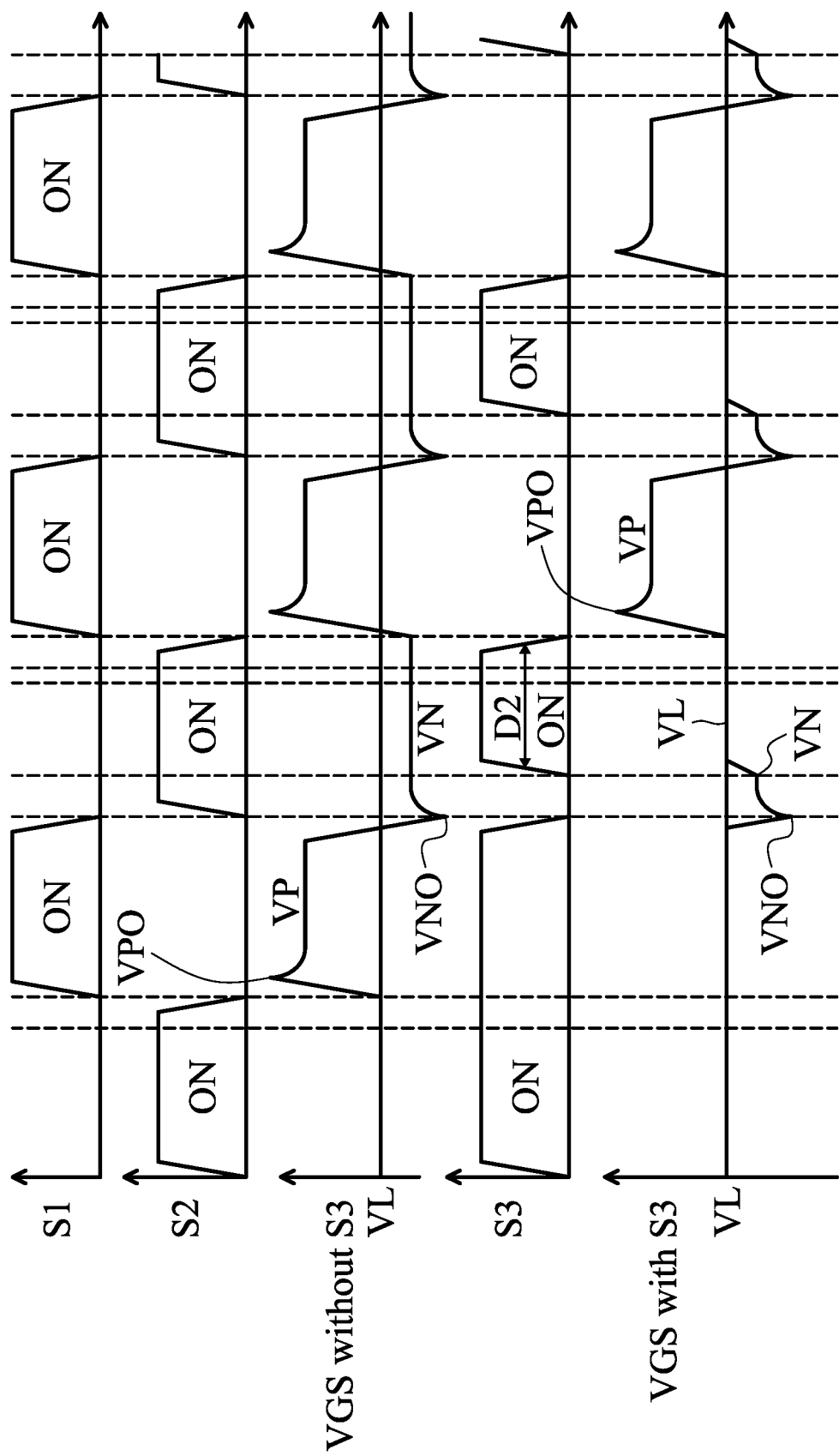
FIG. 5 illustrates the function of the gate-driving circuit in accordance with another embodiment of the invention.

FIG. 5 illustrates the function of the gate-driving circuit in accordance with another embodiment of the invention. Compared FIG. 5 with FIG. 4, the second duty cycle D2 of the third switch S3 in FIG. 5 exceeds the first duty cycle D1 in FIG. 4 so that the duration of the gate-to-source voltage VGS in the low voltage level VL in FIG. 5 is longer than that in FIG. 4. However, the partial negative voltage of the gate-to-source voltage VGS with the third switch S3 can also turn OFF the switch device 10 well.

Figure 6:
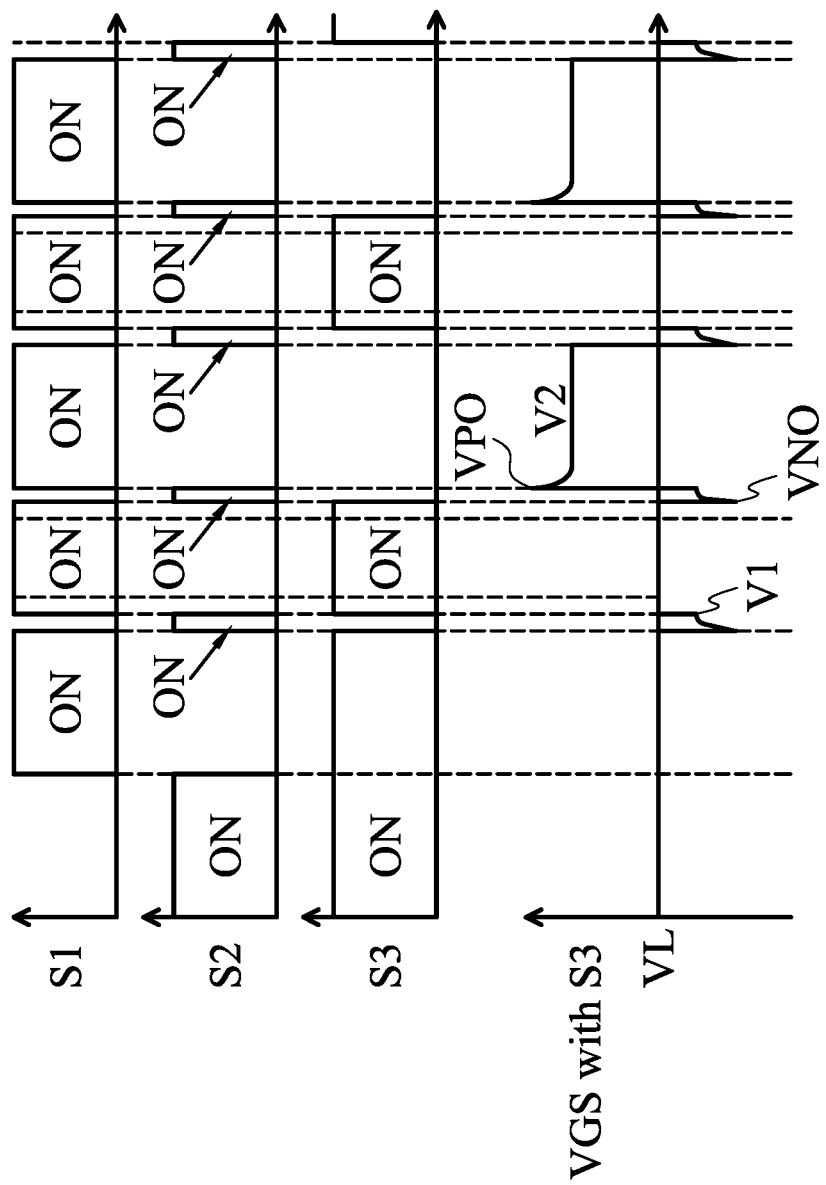
FIG. 6 illustrates the function of the gate-driving circuit in accordance with another embodiment of the invention.

FIG. 6 illustrates the function of the gate-driving circuit in accordance with another embodiment of the invention. As shown in FIG. 6, the duty cycle of the first switch S1 exceeds that of the second switch S2. After the first negative voltage of the gate-to-source voltage VGS with the third switch S3 is generated, the first switch S1 and the third switch S3 are simultaneously turned ON and OFF.

Figure 7:
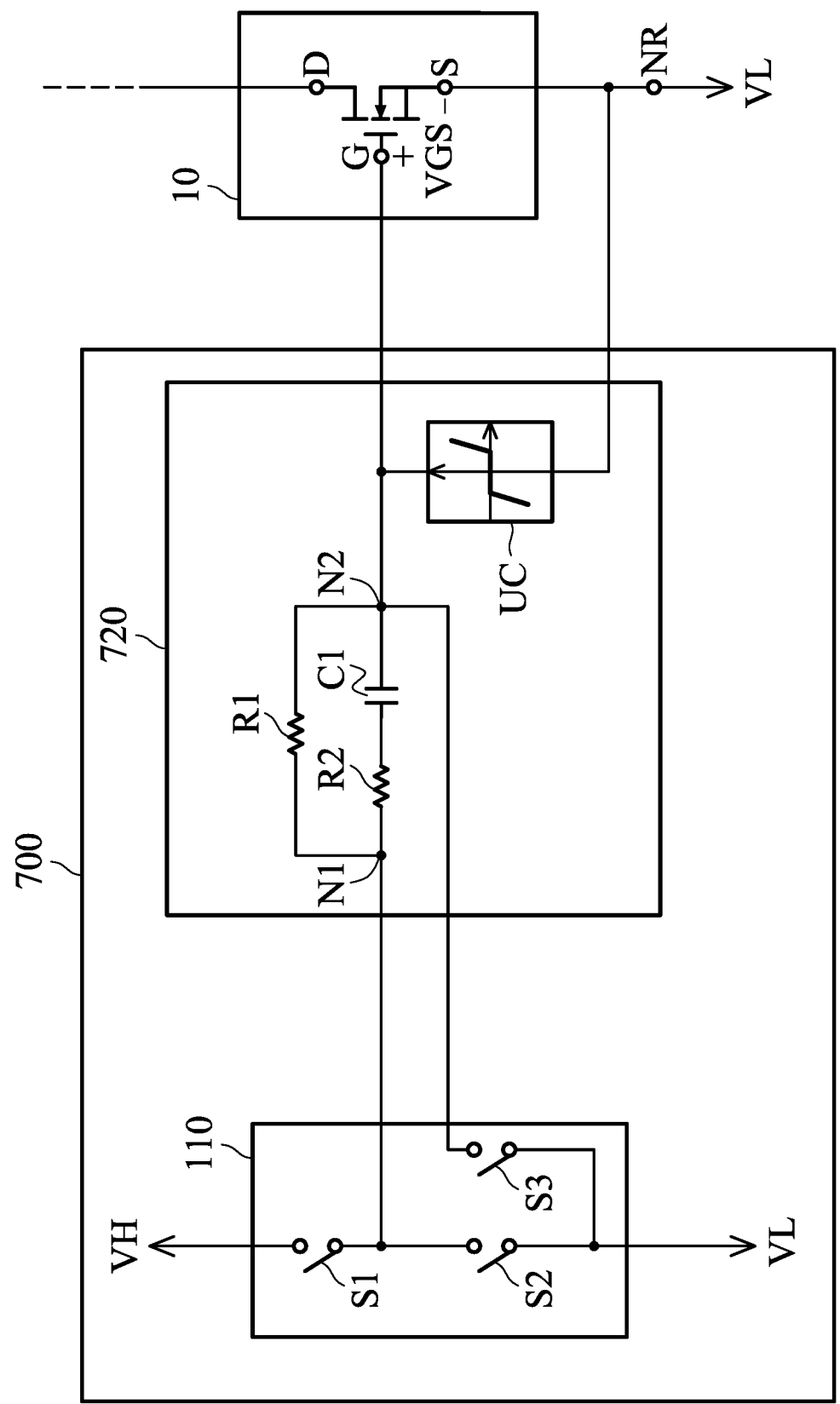
FIG. 7 is a block diagram of a gate-driving circuit in accordance with another embodiment of the invention.

FIG. 7 is a block diagram of a gate-driving circuit in accordance with another embodiment of the invention. As shown in FIG. 7, the gate-driving circuit 700 includes the controller 110 and the waveform conversion circuit 720. Compared the waveform conversion circuit 720 with the waveform conversion circuit 120 in FIG. 1, the waveform conversion circuit 720 further includes a second resistor R2. The second resistor R2 is coupled between the first node N1 and the first capacitor C1. According to an embodiment of the invention, the second resistor R2 and the first capacitor C1 are configured to determine the overshoot voltage VPO and the undershoot voltage VNO as shown in FIGS. 2-6.

Figure 8:
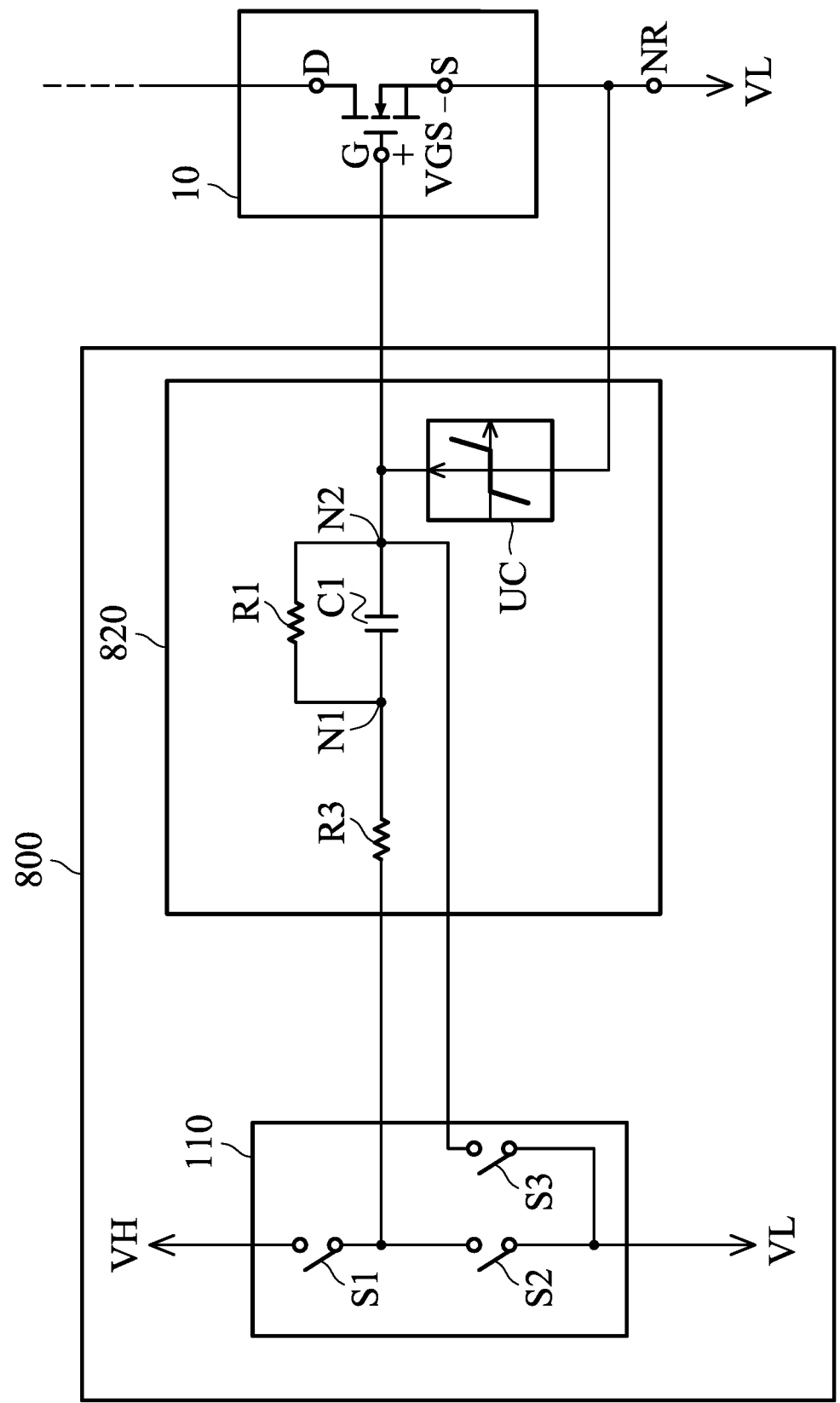
FIG. 8 is a block diagram of a gate-driving circuit in accordance with another embodiment of the invention.

FIG. 8 is a block diagram of a gate-driving circuit in accordance with another embodiment of the invention. As shown in FIG. 8, the gate-driving circuit 800 includes the controller 110 and the waveform conversion circuit 820. Compared the waveform conversion circuit 820 with the waveform conversion circuit 120 in FIG. 1, the waveform conversion circuit 820 further includes a third resistor R3. The third resistor R3 is coupled between the first node N1 and the controller 110.

According to an embodiment of the invention, the total resistance of the first resistor R1 and the third resistor R3 is configured to control a current flowing from the high voltage level VH to the low voltage level VL through the voltage clamp unit UC. In addition, the third resistor R3 and the first capacitor C1 are configured to determine the overshoot voltage VPO and the undershoot voltage VNO as shown in FIGS. 2-6.

Figure 9:
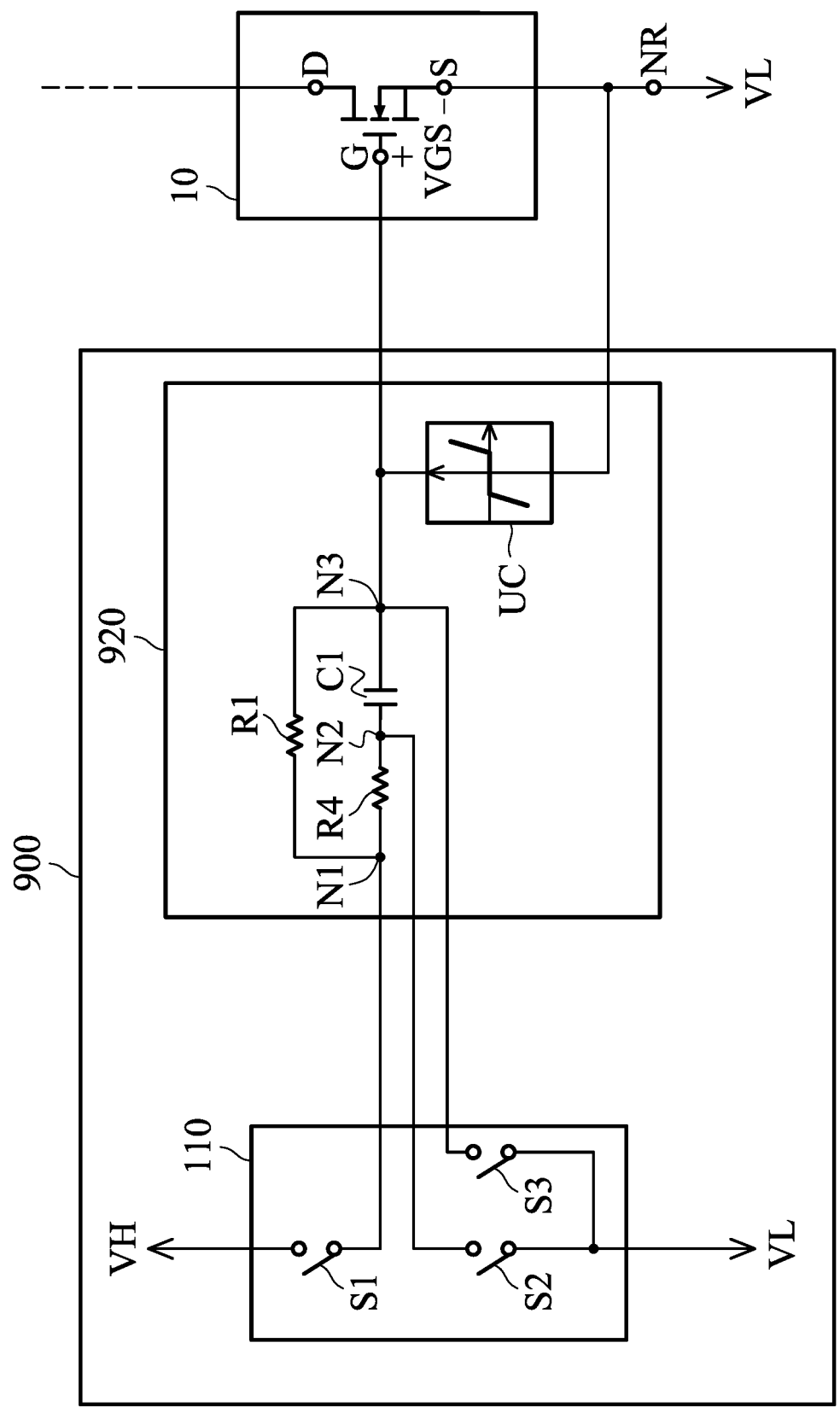
FIG. 9 is a block diagram of a gate-driving circuit in accordance with another embodiment of the invention.

FIG. 9 is a block diagram of a gate-driving circuit in accordance with another embodiment of the invention. As shown in FIG. 9, the gate-driving circuit 900 includes the controller 110 and the waveform conversion circuit 920. The first switch S1 supplies the high voltage level VH to the first node N1. The second switch S2 couples the second node N2 to the low voltage level VL. The third switch S3 couples the third node N3 to the low voltage level VL. The third node N3 is coupled to the gate terminal G of the switch device 10.

The waveform conversion circuit 920 includes a first resistor R1, a fourth resistor R4, and a first capacitor C1. The first resistor R1 is coupled between the first node N1 and the second node N3. The fourth resistor R4 is coupled between the first node N1 and the second node N2. The first capacitor C1 is coupled between the second node N2 and the third node N3. According to another embodiment of the invention, the waveform conversion circuit 920 may further include a voltage clamp unit UC. The voltage clamp unit UC configured to clamp the capacitor voltage VC stored in the first capacitor C1 and the voltage across the gate terminal G and the source terminal S of the switch device 10.

When the first switch S1 provides the high voltage level VH to the first node N1, the resistance of the first resistor R1 is configured to control a current flowing from the high voltage level VH to the low voltage level VL through the voltage clamp unit UC. In addition, the overshoot voltage VPO in FIGS. 2-6 is determined by the fourth resistor R4 and the first capacitor C1, while the undershoot voltage VNO in FIGS. 2-6 is determined by the first capacitor C1 and the parasitic resistance along the path from the second switch S2 to the voltage clamp unit UC.

Figure 10:
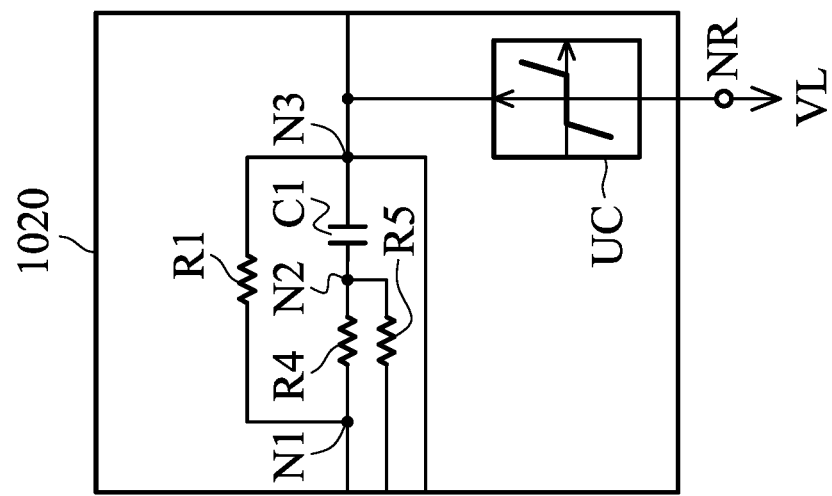
FIG. 10 is a block diagram of a waveform conversion circuit in accordance with another embodiment of the invention.

FIG. 10 is a block diagram of a waveform conversion circuit in accordance with another embodiment of the invention. According to an embodiment of the invention, the waveform conversion circuit 920 may be replaced with the waveform conversion circuit 1020. As shown in FIG. 10, the first node N1 is coupled to the first switch S1, and the third node N3 is coupled to the third switch S3. Compared the waveform conversion circuit 1020 with the waveform conversion circuit 920 in FIG. 9, the waveform conversion circuit 1020 further includes the fifth resistor R5. The fifth resistor R5 is coupled between the second node N2 and the second switch S2. According to another embodiment of the invention, the waveform conversion circuit 1020 may further include a voltage clamp unit UC. According to an embodiment of the invention, the waveform conversion circuit 920 in FIG. 9 may be replaced with the waveform conversion circuit 1120.

When the first switch S1 provides the high voltage level VH to the first node N1, the resistance of the first resistor R1 is configured to control a current flowing from the high voltage level VH to the low voltage level VL through the voltage clamp unit UC. In addition, the overshoot voltage VPO in FIGS. 2-6 is determined by the fourth resistor R4 and the first capacitor C1, while the undershoot voltage VNO in FIGS. 2-6 is determined by the first capacitor C1 and the fifth resistor R5.

Figure 11:
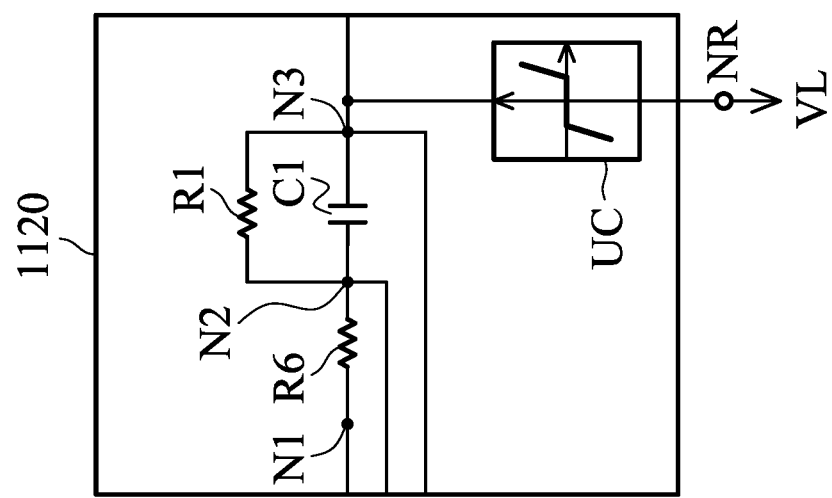
FIG. 11 is a block diagram of a waveform conversion circuit in accordance with another embodiment of the invention.

FIG. 11 is a block diagram of a waveform conversion circuit in accordance with another embodiment of the invention. According to an embodiment of the invention, the waveform conversion circuit 920 in FIG. 9 may be replaced with the waveform conversion circuit 1120. As shown in FIG. 11, the first node N1 is coupled to the first switch S1, the second node N2 is coupled to the second switch S2, and the third node N3 is coupled to the third switch S3. The waveform conversion circuit 1120 includes the first resistor R1, the sixth resistor R6, and the first capacitor C1. According to an embodiment of the invention, the waveform conversion circuit 920 in FIG. 9 may be replaced with the waveform conversion circuit 1120.

The first resistor R1 and the first capacitor C1 are coupled between the second node N2 and the third node N3. The sixth resistor R6 is coupled between the first node N1 and the second node N2. According to another embodiment of the invention, the waveform conversion circuit 1120 may further include a voltage clamp unit UC. The voltage clamp unit UC configured to clamp the capacitor voltage VC stored in the first capacitor C1 and the voltage across the gate terminal G and the source terminal S of the switch device 10.

When the first switch S1 provides the high voltage level VH to the first node N1, the total resistance of the first resistor R1 and the sixth resistor R6 is configured to control a current flowing from the high voltage level VH to the low voltage level VL through the voltage clamp unit UC. In addition, the overshoot voltage VPO in FIGS. 2-6 is determined by the sixth resistor R6 and the first capacitor C1, while the undershoot voltage VNO in FIGS. 2-6 is determined by the first capacitor C1 and the parasitic resistance along the path from the second switch S2 to the voltage clamp unit UC.

Figure 12:
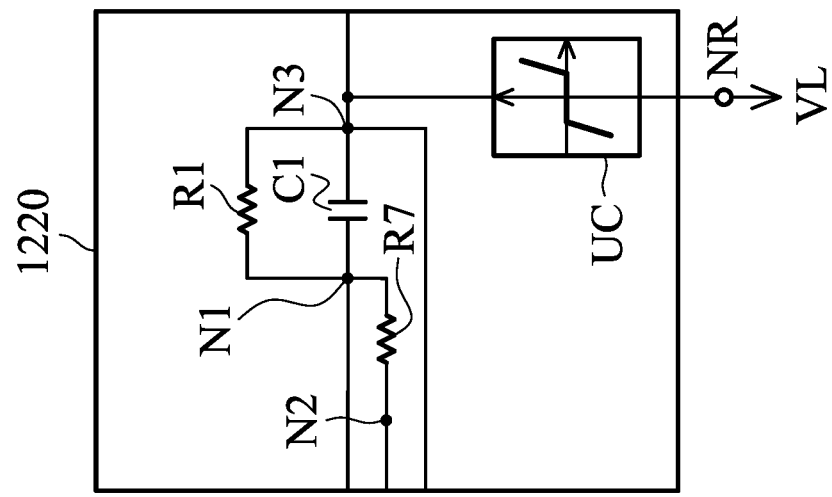
FIG. 12 is a block diagram of a waveform conversion circuit in accordance with another embodiment of the invention.

FIG. 12 is a block diagram of a waveform conversion circuit in accordance with another embodiment of the invention. According to an embodiment of the invention, the waveform conversion circuit 920 in FIG. 9 may be replaced with the waveform conversion circuit 1220. As shown in FIG. 12, the first node N1 is coupled to the first switch S1, the second node N2 is coupled to the second switch S2, and the third node N3 is coupled to the third switch S3. Compared the waveform conversion circuit 1220 with the waveform conversion circuit 920 in FIG. 9, the fourth resistor R4 of the waveform conversion circuit 920 has been replaced by the seventh resistor R7. The seventh resistor R7 is coupled between the second node N2 and the first node N1. The first capacitor C1 is coupled between the first node N1 and the third node N3. According to another embodiment of the invention, the waveform conversion circuit 1120 may further include a voltage clamp unit UC. According to an embodiment of the invention, the waveform conversion circuit 920 in FIG. 9 may be replaced with the waveform conversion circuit 1220.

When the first switch S1 provides the high voltage level VH to the first node N1, the resistance of the first resistor R1 is configured to control a current flowing from the high voltage level VH to the low voltage level VL through the voltage clamp unit UC. In addition, the overshoot voltage VPO in FIGS. 2-6 is determined by the parasitic resistance along the path from the control signal SC to the voltage clamp unit 122 through the first capacitor C1, while the undershoot voltage VNO in FIGS. 2-6 is determined by the first capacitor C1 and the seventh resistor R7.

FIG. 13 is a block diagram of a voltage clamp unit in accordance with an embodiment of the invention. As shown in FIG. 13, the voltage clamp unit UC includes the first zener diode Z1. The first zener diode Z1 includes the first anode NA1 and the second cathode NC1. When a current flows through the first zener diode Z1 from the first anode NA1 to the first cathode NC1, the voltage across the first zener diode Z1 is defined as the first forward voltage VF1. According to an embodiment of the invention, when a current flows through the first zener diode Z1 from the first cathode NC1 to the first anode NA1, the voltage across the first zener diode Z1 is defined as the first reverse breakdown voltage VR1.

According to an embodiment of the invention, when the waveform conversion circuit 120 in FIG. 1 receives the high voltage level VH at the first node N1 and the third switch S3 is turned OFF, the second node N2 is eventually clamped at the first reverse breakdown voltage VR1 of the first zener diode Z1. According to another embodiment of the invention, when the waveform conversion circuit 120 receives the low voltage level VL at the first node N1 and the third switch S3 is turned OFF, the gate terminal G of the switch device 10 is then clamped at a voltage equal to the low voltage level VL minus the first forward voltage VF1 of the first zener diode Z1.

According to an embodiment of the invention, the first forward voltage VF1 is 0.7 V, the first reverse breakdown voltage VR1 is 6 V, the high voltage level VH is 12 V, and the low voltage level VL is 0 V. The gate-to-source voltage VGS of the switch device 10 is clamped at 6V when the voltage at the first node N1 is 12 V, and the gate-to-source voltage VGS is equal to −0.7V when the voltage at the first node N1 is 0 V. Therefore, when the switch device 10 is illustrated as a normally-off GaN FET, the turn-on resistance of the switch device 10 could be kept low due to the 6V gate-to-source voltage VGS, and the switch device 10 could be fully turned off due to the −0.7V gate-to-source voltage VGS.

FIG. 14 is a block diagram of a voltage clamp unit in accordance with another embodiment of the invention. Comparing the voltage clamp unit UC in FIG. 14 with that in FIG. 13, the second anode NA2 of the second zener diode Z2 is coupled to the second node N2 and the low voltage level VL is applied to the second cathode NC2 of the second zener diode Z2. According to an embodiment of the invention, when the waveform conversion circuit 120 in FIG. 1 receives the high voltage level VH at the first node N1, the gate-to-source voltage VGS is determined by the second forward voltage VF2 of the second zener diode Z2. According to another embodiment of the invention, when the waveform conversion circuit 120 in FIG. 1 receives the low voltage level VL at the first node N1, the gate terminal G of the switch device 10 is then eventually clamped at a voltage equal to the low voltage level VL minus the second reverse breakdown voltage VR2 of the second zener diode Z2.

FIG. 15 is a block diagram of a voltage clamp unit in accordance with another embodiment of the invention. As shown in FIG. 15, the voltage clamp unit UC includes the third zener diode Z3 and the fourth zener diode Z4. The third anode NA3 of the third zener diode Z3 is coupled to the fourth anode NA4 of the fourth zener diode Z4. The third cathode NC3 is coupled to the gate terminal G of the switch device 10, and the fourth cathode NC4 is coupled to the source of the switch device 10.

According to an embodiment of the invention, when the waveform conversion circuit 120 in FIG. 1 receives the high voltage level VH at the first node N1, gate-to-source voltage VGS is clamped at the sum of the third reverse breakdown voltage VR3 of the third zener diode Z3 and the fourth forward voltage VF4 of the fourth zener diode Z4. According to another embodiment of the invention, when the waveform conversion circuit 120 in FIG. 1 receives the low voltage level VL at the first node N1, the gate terminal G of the switch device 10 is then clamped at a voltage equal to the low voltage level VL minus the sum of the third forward voltage VF3 of the third zener diode Z3 and the fourth reverse breakdown voltage VR4 of the fourth zener diode Z4.

FIG. 16 is a block diagram of a voltage clamp unit in accordance with another embodiment of the invention. As shown in FIG. 16, the voltage clamp unit UC includes the fifth diode D5 which has a fifth anode NA5, a fifth cathode NC5, and a fifth forward voltage VF5. The fifth anode NA5 is coupled to the gate terminal G of the switch device 10, and the fifth cathode NC5 is coupled to the source of the switch device 10. According to an embodiment of the invention, when the waveform conversion circuit 120 in FIG. 1 receives the high voltage level VH at the first node N1, the gate-to-source voltage VGS of the switch device 10 is determined by the fifth forward voltage VF5 of the fifth diode Z5.

According to another embodiment of the invention, when the waveform conversion circuit 120 in FIG. 1 receives the low voltage level VL at the first node N1, the gate-to-source voltage VGS is equal to the capacitor voltage VC stored in the first capacitor C1, since the fifth diode D5 is open during reverse biasing. In addition, the capacitor voltage VC is equal to the high voltage level VH minus the fifth forward voltage VF5.

Figure 17:
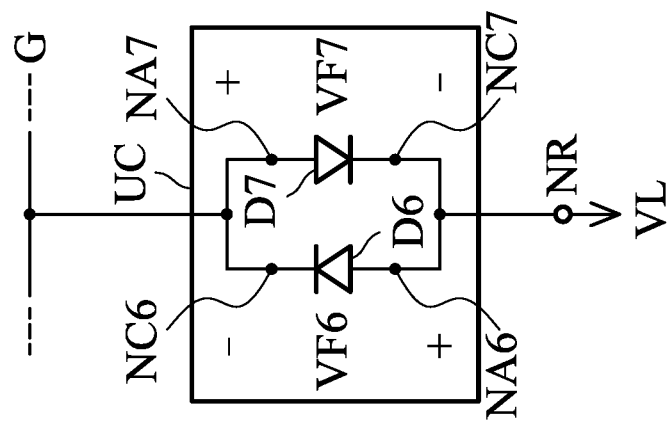
FIG. 17 is a block diagram of a voltage clamp unit in accordance with another embodiment of the invention.

FIG. 17 is a block diagram of a voltage clamp unit in accordance with another embodiment of the invention. As shown in FIG. 17, the voltage clamp unit UC includes the sixth diode D6, which has a sixth anode NA6, a sixth cathode NC6, and a sixth forward voltage VF6, and the seventh diode D7, which has a seventh anode NA7, a seventh cathode NC7, and a seventh forward voltage VF7. The sixth anode NA6 and the seventh cathode NC7 are coupled to the source of the switch device 10, and the sixth cathode NC6 and the seventh anode NA7 are coupled to the gate terminal G of the switch device 10.

According to an embodiment of the invention, when the waveform conversion circuit 120 in FIG. 1 receives the high voltage level VH at the first node N1, the gate-to-source voltage VGS is determined by the seventh forward voltage VF7 of the sixth diode Z7. According to another embodiment of the invention, when the waveform conversion circuit 120 in FIG. 1 receives the low voltage level VL at the first node N1, the gate terminal G of the switch device 10 is clamped at a voltage equal to the low voltage level VL minus the sixth forward voltage VF6.

Figure 18:
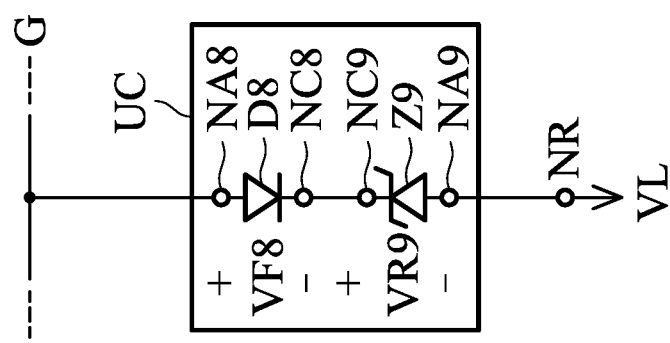
FIG. 18 is a block diagram of a voltage clamp unit in accordance with another embodiment of the invention.

FIG. 18 is a block diagram of a voltage clamp unit in accordance with another embodiment of the invention. As shown in FIG. 18, the voltage clamp unit UC includes the eighth diode D8, which has an eighth forward voltage VF8, and the ninth zener diode Z9, which has a ninth reverse breakdown voltage VR9. The eighth anode NA8 of the eighth diode D8 is coupled to the gate terminal G of the switch device 10. The eighth cathode NC8 of the eighth diode D8 is coupled to the ninth cathode NC9 of the ninth zener diode Z9. The ninth anode NA9 is coupled to the source of the switch device 10.

According to an embodiment of the invention, when the waveform conversion circuit 120 in FIG. 1 receives the high voltage level VH at the first node N1, the gate-to-source voltage VGS is clamped at a clamped voltage equal to the sum of the eighth forward voltage VF8 of the eighth diode D8 and the ninth reverse breakdown voltage VR9 of the ninth zener diode Z9. Therefore, the capacitor voltage VC stored in the first capacitor C1 is equal to the high voltage level VH minus the clamped voltage. According to another embodiment of the invention, when the waveform conversion circuit 120 in FIG. 1 receives the low voltage level VL at the first node N1, the gate-to-source voltage VGS is equal to the capacitor voltage VC stored in the first capacitor C1, since the eighth diode D8 is open during reverse biasing. In addition, the capacitor voltage VC is equal to the high voltage level VH minus the sum of the eighth forward voltage VF8 of the eighth diode D8 and the ninth reverse breakdown voltage VR9 of the ninth zener diode Z9.

Figure 19:
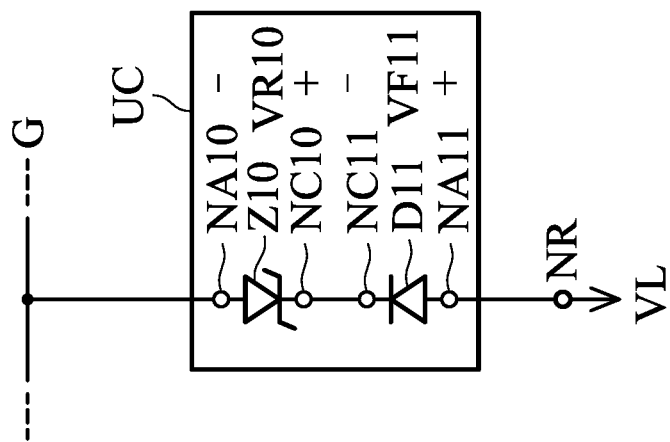
FIG. 19 is a block diagram of a voltage clamp unit in accordance with another embodiment of the invention.

FIG. 19 is a block diagram of a voltage clamp unit in accordance with another embodiment of the invention. As shown in FIG. 19, the voltage clamp unit UC includes the tenth zener diode Z10 and the eleventh diode D11. The tenth anode NA10 of the tenth zener diode Z10 is coupled to the gate terminal G of the switch device 10. The tenth cathode NC10 is coupled to the eleventh cathode NC11 of the eleventh diode D11, and the eleventh anode NA11 is coupled to the source of the switch device 10.

According to an embodiment of the invention, when the waveform conversion circuit 120 in FIG. 1 receives the high voltage level VH at the first node N1, gate-to-source voltage VGS is equal to the high voltage level VH, since the eleventh diode D11 is open during forward biasing. According to another embodiment of the invention, when the waveform conversion circuit 120 in FIG. 1 receives the low voltage level VL at the first node N1, the gate terminal G of the switch device 10 is then clamped at a voltage equal to the low voltage level VL minus the sum of the tenth reverse breakdown voltage VR10 of the tenth zener diode Z10 and the eleventh forward voltage VF11 of the eleventh diode D11.

According to some embodiment of the invention, the voltage clamp unit UC in FIGS. 1 and 7-12 can be implemented by the voltage clamp unit UC illustrated in FIGS. 13-19. According to some embodiments of the invention, the operations of the waveform conversion circuit 120 in FIGS. 13-19 are described based on the third switch S3 being turned OFF. When the third switch S3 is ON, the gate-to-source voltage VGS is the low voltage level VL so that the switch device 10 is turned OFF.

A gate-driving circuit for driving a switch device is provided herein. A third switch is incorporated into the gate-driving circuit to prevent coupling noise from other circuits around the gate-driving circuit during startup so that the switch device can be properly driven.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A gate-driving circuit for turning on and off a switch device having a gate terminal, a drain terminal, and a source terminal coupled to a reference node, the gate-driving circuit comprising:
   a controller, comprising:
      a first switch, supplying a high voltage level to a first node;
      a second switch, coupling the first node to a low voltage level of the reference node; and
      a third switch, coupling a second node to the low voltage level, wherein the second node is coupled to the gate terminal, wherein when the first switch is turned on for the first time during startup, the third switch is turned on simultaneously; and
   a waveform conversion circuit, comprising:
      a first resistor, coupled between the first node and the second node; and
      a first capacitor, coupled between the first node and the second node.

2. The gate-driving circuit of claim 1, wherein after the first switch is turned on for the first time, the third switch is turned on after the second switch is turned on and the third switch is turned off before the first switch is turned on.

3. The gate-driving circuit of claim 1, wherein after the first switch is turned on for the first time, the first switch and the third switch are simultaneously turned on.

4. The gate-driving circuit of claim 1, wherein after the first switch is turned on for the first time, the third switch stays off.

5. The gate-driving circuit of claim 1, wherein the waveform conversion circuit further comprises:
   a second resistor, coupled between the first capacitor and the first node.

6. The gate-driving circuit of claim 1, wherein the waveform conversion circuit further comprises:
   a third resistor, coupled between the first node and the controller.

7. The gate-driving circuit of claim 1, wherein the first switch and the second switch are alternately turned on and off to alternately provide the high voltage level and the low voltage level to the first node, wherein the waveform conversion circuit converts the low voltage level to a first voltage at the second node and converts the high voltage level to a second voltage at the second node.

8. The gate-driving circuit of claim 7, wherein the waveform conversion circuit further comprises:
   a voltage clamp unit, coupled between the gate terminal and the source terminal of the switch device and configured to clamp the second voltage.

9. A gate-driving circuit for turning on and off a switch device having a gate terminal, a drain terminal, and a source terminal coupled to a reference node, the gate-driving circuit comprising:
   a controller, comprising:
      a first switch, supplying a high voltage level to a first node;
      a second switch, coupling a second node to a low voltage level of the reference node; and
      a third switch, coupling a third node to the low voltage level, wherein the third node is coupled to the gate terminal, wherein when the first switch is turned on for the first time during startup, the third switch is turned on simultaneously; and
   a waveform conversion circuit, comprising:
      a first resistor, coupled between the first node and the third node;
      a fourth resistor, coupled between the first node and the second node; and
      a first capacitor, coupled between the second node and the third node.

10. The gate-driving circuit of claim 9, wherein after the first switch is turned on for the first time, the third switch is turned on after the second switch is turned on and the third switch is turned off before the first switch is turned on.

11. The gate-driving circuit of claim 9, wherein after the first switch is turned on for the first time, the first switch and the third switch are simultaneously turned on.

12. The gate-driving circuit of claim 9, wherein after the first switch is turned on for the first time, the third switch stays off.

13. The gate-driving circuit of claim 9, wherein the waveform conversion circuit further comprises:
a fifth resistor, coupled between the second switch and the second node.

14. The gate-driving circuit of claim 9, wherein the first switch and the second switch are alternately turned on and off to alternately provide the high voltage level and the low voltage level, wherein the waveform conversion circuit converts the low voltage level to a first voltage at the third node and converts the high voltage level to a second voltage at the third node.

15. The gate-driving circuit of claim 14, wherein the waveform conversion circuit further comprises:
a voltage clamp unit, coupled between the gate terminal and the source terminal of the switch device and configured to clamp the second voltage.

16. A gate-driving circuit for turning on and off a switch device having a gate terminal, a drain terminal, and a source terminal coupled to a reference node, the gate-driving circuit comprising:
a controller, comprising:
a first switch, supplying a high voltage level to a first node;
a second switch, coupling a second node to a low voltage level of the reference node; and
a third switch, coupling a third node to the low voltage level, wherein the third node is coupled to the gate terminal, wherein when the first switch is turned on for the first time during startup, the third switch is turned on simultaneously; and
a waveform conversion circuit, comprising:
a first resistor, coupled between the second node and the third node;
a sixth resistor, coupled between the first node and the second node; and
a first capacitor, coupled between the second node and the third node.

17. The gate-driving circuit of claim 16, wherein after the first switch is turned on for the first time, the third switch is turned on after the second switch is turned on and the third switch is turned off before the first switch is turned on.

18. The gate-driving circuit of claim 16, wherein after the first switch is turned on for the first time, the first switch and the third switch are simultaneously turned on.

19. The gate-driving circuit of claim 16, wherein after the first switch is turned on for the first time, the third switch stays off.

20. The gate-driving circuit of claim 16, wherein the first switch and the second switch are alternately turned on and off to alternately provide the high voltage level and the low voltage level, wherein the waveform conversion circuit converts the low voltage level to a first voltage at the third node and converts the high voltage level to a second voltage at the third node.

21. The gate-driving circuit of claim 20, wherein the waveform conversion circuit further comprises:
a voltage clamp unit, coupled between the gate terminal and the source terminal of the switch device and configured to clamp the second voltage.

22. A gate-driving circuit for turning on and off a switch device having a gate terminal, a drain terminal, and a source terminal coupled to a reference node, the gate-driving circuit comprising:
a controller, comprising:
a first switch, supplying a high voltage level to a first node;
a second switch, coupling a second node to a low voltage level of the reference node; and
a third switch, coupling a third node to the low voltage level, wherein the third node is coupled to the gate terminal, wherein when the first switch is turned on for the first time during startup, the third switch is turned on simultaneously; and
a waveform conversion circuit, comprising:
a first resistor, coupled between the first node and the third node;
a seventh resistor, coupled between the first node and the second node; and
a first capacitor, coupled between the first node and the third node.

23. The gate-driving circuit of claim 22, wherein after the first switch is turned on for the first time, the third switch is turned on after the second switch is turned on and the third switch is turned off before the first switch is turned on.

24. The gate-driving circuit of claim 22, wherein after the first switch is turned on for the first time, the first switch and the third switch are simultaneously turned on.

25. The gate-driving circuit of claim 22, wherein after the first switch is turned on for the first time, the third switch stays off.

26. The gate-driving circuit of claim 22, wherein the first switch and the second switch are alternately turned on and off to alternately provide the high voltage level and the low voltage level, wherein the waveform conversion circuit converts the low voltage level to a first voltage at the third node and converts the high voltage level to a second voltage at the third node.

27. The gate-driving circuit of claim 26, wherein the waveform conversion circuit further comprises:
a voltage clamp unit, coupled between the gate terminal and the source terminal of the switch device and configured to clamp the second voltage.

* * * * *